United States Patent [19]
Kurtz et al.

[11] Patent Number: 5,995,529
[45] Date of Patent: Nov. 30, 1999

[54] INFRARED LIGHT SOURCES WITH SEMIMETAL ELECTRON INJECTION

[75] Inventors: Steven R. Kurtz; Robert M. Biefeld; Andrew A. Allerman, all of Albuquerque, N.Mex.

[73] Assignee: Sandia Corporation, Albuquerque, N.Mex.

[21] Appl. No.: 08/838,573

[22] Filed: Apr. 10, 1997

[51] Int. Cl.[6] .................................................. H01S 3/19
[52] U.S. Cl. .............................. 372/45; 257/94; 257/96; 257/97
[58] Field of Search .......................... 372/45, 46, 43; 257/94, 96, 97, 13

[56] References Cited

U.S. PATENT DOCUMENTS

| | | | |
|---|---|---|---|
| 4,916,495 | 4/1990 | Awano | 257/17 |
| 5,212,706 | 5/1993 | Jain | 372/50 |
| 5,457,709 | 10/1995 | Capasso | 372/45 |
| 5,509,025 | 4/1996 | Capasso | 372/45 |
| 5,570,386 | 10/1996 | Capasso | 372/46 |
| 5,588,015 | 12/1996 | Yang | 372/45 |
| 5,594,750 | 1/1997 | Zhang et al. | 372/45 |

OTHER PUBLICATIONS

R. J. Menna, D. R. Capewell, R. U. Martinelli, P. K. York, and R. E. Enstrom, "3.06 μm InGaAsSb/InPSb Diode Lasers Grown by Organometallic Vapor–Phase Epitaxy," *Applied Physics Letters*, vol. 59, pp. 2127–2129 (Oct. 21, 1991).

S. R. Kurtz, R. M. Biefeld, L. R. Dawson, K. C. Baucom, and A. J. Howard, "Midwave (4μm) Infrared Lasers and Light–Emitting Diodes with Biaxially Compressed InAsSb Active Regions," *Applied Physics Letters*, vol. 64, pp. 812–814 (Feb. 14, 1994).

S. R. Kurtz and R. M. Biefeld, "Magnetophotoluminescence of Biaxially Compressed InAsSb Quantum Wells," *Applied Physics Letters*, vol. 66, pp. 364–366 (Jan. 16, 1995).

Z. L. Liau and H. K. Choi, $InAs_{1-x}Sb_x/In_{1-y}Ga_yAs$ Multiple–Quantum–Well Heterostructure Design for Improved 4–5 μm Lasers, *Applied Physics Letters*, vol. 64, pp. 3219–3221 (Jun. 13, 1994).

H. K. Choi and G. W. Turner, "InAsSb/InAlAsSb Strained Quantum–Well Diode Lasers Emitting at 3.9 μm," *Applied Physics Letters*, vol. 67, pp. 332–334 (Jul. 17, 1995).

D. Z. Garbozov, R. U. Martinelli, R. J. Menna, P. K., York, H. Lee, S. Y. Narayan, and J. C. Connolly, "2.7–μm InGaAsSb/AlGaAsSb Laser Diodes with Continuous–Wave Operation up to –39°C" *Applied Physics Letters*, vol. 67, pp. 1346–1348 (Sep. 4, 1995).

D. H. Chow, R. H. Miles, T. C. Hasenbert, A. R. Kost, Y.–H. Zhang, H. L. Dunlap, and L. West, "Mid–Wave Infrared Diode Lasers based on GaInSb/InAs and InAs/AlSb Superlattices," *Applied Physics Letters*, vol. 67, pp. 3700–3702 (Dec. 18, 1995).

J. R. Meyer, I. Vurgaftman, R. Q. Yang, and L. R. Ram–Mohan, "Type–II and Type–I Interband Cascade Lasers," *Electronics Letters*, vol. 32, pp. 45–46 (Jan. 4, 1996).

(List continued on next page.)

*Primary Examiner*—James W. Davie
*Assistant Examiner*—Michael J. Stahl
*Attorney, Agent, or Firm*—John P. Hohimer

[57] ABSTRACT

An infrared light source is disclosed that comprises a layered semiconductor active region having a semimetal region and at least one quantum-well layer. The semimetal region, formed at an interface between a GaAsSb or GaInSb layer and an InAsSb layer, provides electrons and holes to the quantum-well layer to generate infrared light at a predetermined wavelength in the range of 2–6 μm. Embodiments of the invention can be formed as electrically-activated light-emitting diodes (LEDs) or lasers, and as optically-pumped lasers. Since the active region is unipolar, multiple active regions can be stacked to form a broadband or multiple-wavelength infrared light source.

46 Claims, 7 Drawing Sheets

OTHER PUBLICATIONS

C. A. Wang, K. F. Jensen, A. C. Jones and H. K. Choi, "n–AlGaSb and GaSb/AlGaSb Double–Heterostructure Lasers Grown by Organometalic Vapor Phase Epitaxy," *Applied Physics Letters,* vol. 68, pp. 400–402 (Jan. 15, 1996).

R. M. Biefeld, A. A. Allerman, and M. W. Pelczynski, "Growth of n–and p–Type Al(As)Sb by Metalorganic Chemical Vapor Deposition," *Applied Physics Letters,* vol. 68, pp. 932–934 (Feb. 12, 1996).

S. R. Kurtz, R. M. Biefeld, A. A. Allerman, A. J. Howard, M. H. Crawford, and M. W. Pelczynski, "Pseudomorphic InAsSb Multiple Quantum Well Injection Laser Emitting at 3.5 $\mu$m," *Applied Physics Letters,* vol. 68, pp. 1332–1334 (Mar. 4, 1996).

A. A. Allerman, R. M. Biefeld, and S. R. Kurtz, InAsSb–Based Mid–Infrared Lasers (3.8–3.9 $\mu$m) and Light–Emitting Diodes with AlAsSb Claddings and Semimetal Electron Injection, Grown by Metalorganic Chemical Vapor Deposition, *Applied Physics Letters,* vol. 69, pp. 465–467 (Jul. 22, 1996).

R. D. Yang, C.–H. Lin, P. C. Chang, S. J. Murry, D. Zhang, S. S. Pei, S. R. Kurtz, A.–N. Chu and F. Ren, "Mid–IR Interband Cascade Electroluminescence in Type–II Quantum Wells," *Electronics Letters,* vol. 32, pp. 1621–1622 (Aug. 15, 1996).

INFRARED LIGHT SOURCES WITH SEMIMETAL ELECTRON INJECTION

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates generally to semiconductor light sources that emit infrared radiation at a wavelength in the range of 2–6 microns ($\mu$m), and in particular to a semiconductor infrared light source that has a quantum-well active region that includes a semimetal region formed at an interface between two semiconductor layers.

BACKGROUND OF THE INVENTION

Infrared light sources including semiconductor light-emitting diodes and semiconductor lasers are useful for many applications including fluoride-based optical-fiber communications, spectroscopy, chemical and pollution sensing, process monitoring, and infrared laser radar and countermeasures. However, the performance of infrared light sources in the 2–6 $\mu$m wavelength range has been limited by nonradiative recombination processes (usually Auger recombination) which dominate radiative recombination in narrow-bandgap semiconductors.

Infrared lasers termed "quantum cascade" lasers have recently been disclosed by Capasso et al in U.S. Pat. Nos. 5,457,709; 5,509,025 and 5,570,386. Such "quantum cascade" lasers are based on intersubband transitions of electrons in a multilayer semiconductor structure that comprises doped semiconductor material of only a first conductivity type. Such "quantum cascade" lasers are not based on electron-hole recombination, and do not include a semimetal region.

An advantage of the infrared light source of the present invention is the provision of a semimetal region within the active region to produce electrons therein for the generation of infrared light.

Another advantage of the present invention is that a plurality of active regions can be stacked to form an infrared light source that emits at a plurality of different wavelengths, or to form an infrared light source having a broadband emission.

A further advantage is that the infrared light source of the present invention can be formed as a light-emitting diode (LED) or as a laser.

Yet another advantage of the present invention is that a laser structure can be formed with a plurality of vertically stacked active regions to provide an increased gain and lasing output power.

These and other advantages of the infrared light source of the present invention will become evident to those skilled in the art.

SUMMARY OF THE INVENTION

The present invention relates to an infrared light source comprising a layered semiconductor active region including at least one quantum-well layer and further including a semimetal region located near the quantum-well layer to provide a source of electrons and holes to the quantum-well layer for the generation of light by electron-hole recombination. The semimetal region is formed by a junction of two dissimilar semiconductor layers, with the layers preferably comprising GaAs$_y$Sb$_{1-y}$ (0$\leq$y$\leq$0.3) and InAs$_{1-x}$Sb$_x$ (0$\leq$x$\leq$0.4), respectively. Cladding layers, preferably comprising AlAsSb, can be provided on one or both sides of the active region for improved electron confinement. Embodiments of the present invention can be formed as light-emitting diodes, as optically-activated semiconductor lasers, and as electrically-activated semiconductor lasers. Semiconductor alloy compositions of the layered active region can be predetermined to provide infrared light in one or more emission bands at wavelengths within the range of 2–6 $\mu$m. No tunnel junctions are used in the infrared light source of the present invention.

Additional advantages and novel features of the invention will become apparent to those skilled in the art upon examination of the following description, or can be learned by practice of the invention. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1:
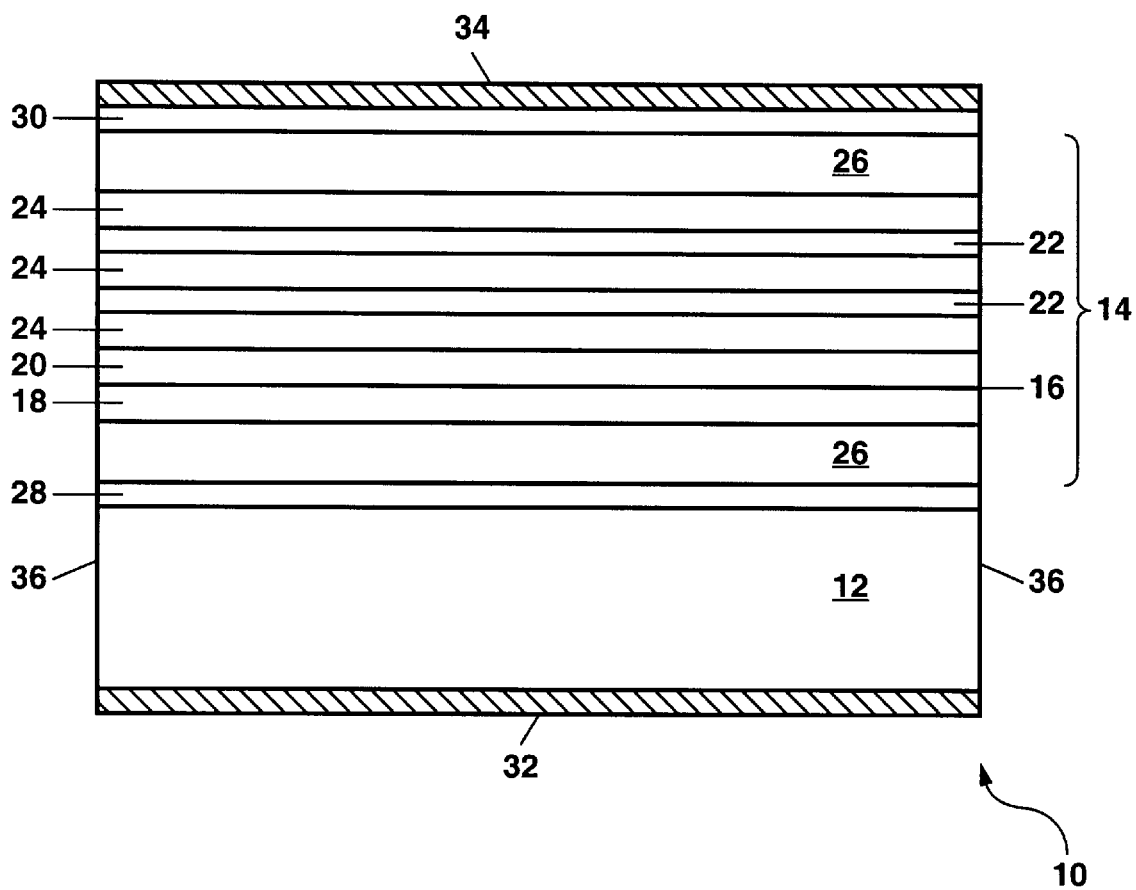
FIG. 1 shows a schematic cross-section illustration of an embodiment of the infrared light source formed according to the present invention.

Referring to FIG. 1, there is shown an embodiment of the infrared light source 10 of the present invention. In FIG. 1, the infrared light source 10 comprises a substrate 12 upon which are epitaxially grown a plurality of semiconductor layers forming an active region 14. The active region 14 further comprises a semimetal region 16 formed about a heterojunction between a pair of dissimilar semimetal-forming semiconductor layers, 18 and 20, and at least one quantum-well layer 22. When more than one quantum-well layer is provided, each quantum-well layer 22 can be surrounded by barrier layers 24 for electron confinement.

Electron confinement within one or more quantum-well layers 22 can be further improved by providing a cladding layer 26 on a side of the active region 14 away from the semimetal region 16, or by providing a pair of cladding layers 26 on both sides of the active region 14 as shown in FIG. 1.

In the embodiment of the present invention in FIG. 1, the order of growth of the various semiconductor layers will be described with reference to epitaxial growth on an n-type indium arsenide (InAs) substrate 12. It will be understood by those skilled in the art that other types of III-V compound semiconductor substrates 12 can be used, including gallium antimonide (GaSb), indium phosphide (InP) and indium gallium arsenide antimonide (InGaAsSb). It will be further understood by those skilled in the art that the order of growth of the semiconductor layers in FIG. 1 can be reversed for embodiments of the infrared light source 10 formed on a p-type substrate 12.

In FIG. 1, the semiconductor layers forming the active region 14 can be epitaxially grown on the substrate 12 by metal-organic chemical vapor deposition (MOCVD), molecular beam epitaxy (MBE), or the like. Formation of the infrared light source 10 by MOCVD growth can be performed in a low-pressure (70–200 torr) MOCVD growth system at a temperature of 500–600° C. with Group V/Group III ratios between 1.1 and 16. Trimethylamine alane (TMAA) or ethyldimethylamine alane (EDMAA) can be used as source gases for aluminum (Al); trimethylgallium (TMG) or triethylgallium (TEGa) can be used as a source gases for gallium (Ga); arsine ($AsH_3$) can be used as a source gas for arsenic (As); trimethylantimony (TMSb) or triethylantimony (TESb) can be used as a source gases for antimony (Sb); trimethylindium (TMIn) can be used as a source gas for indium (In); and hydrogen ($H_2$) is used as a carrier gas. A $H_2$ purge time of about 15–20 seconds with the source gases switched out of the growth chamber can be used between layers of different semiconductor alloy composition.

For the embodiment of the present invention in FIG. 1, the epitaxial growth is initiated with the growth of a buffer layer 28 for smoothing or conditioning an upper surface of the substrate prior to growth of the remaining semiconductor layers. The buffer layer 28 can comprise the semiconductor alloy used for the substrate 12 (e.g. InAs) or a semiconductor alloy that is substantially lattice-matched to the substrate 12 (i.e. a semiconductor alloy that has a lattice constant, $a_0$, that is substantially equal to the lattice constant of the substrate).

In FIG. 1, for MOCVD growth on an InAs substrate 12, the buffer layer 28 can comprise either InAs or gallium arsenide antimonide (GaAsSb). An InAs buffer layer 28 can be n-type doped when the substrate is n-type. For growth on an InAs substrate 12, a GaAsSb buffer layer 28 preferably comprises $GaAs_{0.09}Sb_{0.91}$ for lattice matching to the substrate 12. A MOCVD-grown GaAsSb buffer layer 28 is generally left undoped due to the difficulty of n-type doping of GaAsSb. Such an undoped GaAsSb buffer layer 28 has a residual p-type doping of up to about $4-7\times10^{16}$ cm$^{-3}$ as measured from room-temperature Hall measurements using the Van der Pauw technique for GaAsSb layers grown on semi-insulating GaAs. The thickness of the buffer layer 28 is generally about 1 μm or less.

In FIG. 1, a cladding layer 26 is epitaxially grown above the buffer layer 28. his first-grown cladding layer 26 can be omitted from some embodiments of the present invention, and in particular for certain light-emitting diode (LED) embodiments of the invention (e.g. for vertically-emitting LEDs wherein the infrared light is emitted in a direction substantially perpendicular to the cladding layer 26) that do not require waveguiding of the generated infrared light. The cladding layer 26 preferably comprises AlAsSb (e.g. $AlAs_{0.16}Sb_{0.84}$) with a layer thickness of up to several microns (e.g. 2.5 μm). In other embodiments of the present invention, the cladding layer can comprise AlSb or InPSb. The optimum conditions for MOCVD growth of AlAsSb employed a V/III ratio near 3.5, assuming a vapor pressure of 0.75 torr for EDMAA at 19.8° C., a 500° C. growth temperature, 200 torr pressure, and a growth rate of 1 μm/hour. The use of EDMAA as a starting gas for growth of the AlAsSb cladding layer(s) 26 generally yielded more reproducible results in terms of semiconductor alloy composition control than did the use of TMAA.

The cladding layer 26 forms an energy barrier to confine electrons within a central portion of the active region 14 containing the semimetal region 16 and one or more quantum-well layers 22. The cladding layers 26 in FIG. 1 have an index of refraction lower than that of the intervening semiconductor layers and, therefore, can also provide optical confinement for waveguiding of the generated infrared light which is advantageous for forming edge-emitting devices (e.g. edge-emitting semiconductor lasers or LEDs) wherein the infrared light is emitted in a direction substantially parallel to the cladding layer 26. The AlAsSb cladding layer 26 in FIG. 1 is not intentionally doped (i.e. undoped) and has a background or residual hole concentration of about $1-3\times10^{17}$ cm$^{-3}$ from room-temperature Hall measurements.

In FIG. 1, first and second semimetal-forming layers 18 and 20, respectively, are epitaxially grown above the first-grown cladding layer 26. The semimetal region 16 is formed about an interface or junction between the layers 18 and 20 due to a slight overlap of the valence band of one layer with the conduction band of the other layer. Because of the slight band overlap in the semimetal region 16 in FIG. 1, electrons can be transferred directly from the valence band of layer 18 into the conduction band of layer 20 to provide a source of electrons and holes for the generation of infrared light in one or more quantum-well layers 22.

In the embodiment of the present invention of FIG. 1, the first semimetal-forming layer 18 can comprise GaAsSb (e.g. $GaAs_{0.9}Sb_{0.91}$) with a layer thickness of about 20 nanometers. The GaAsSb layer 18 is preferably undoped (i.e. not intentionally doped) when grown by MOCVD and generally has a residual p-type doping of about $4-7\times10^{16}$ cm$^{-3}$. In embodiments of the present invention wherein the first-grown cladding layer 26 is omitted (e.g. for vertically-emitting LEDs), the GaAsSb layer 18 can be formed as an extension of a GaAsSb buffer layer 28. Alternately, the first semimetal-forming layer 18 can comprise GaInSb.

In FIG. 1, the second semimetal-forming layer 20 can comprise $InAs_{1-x}Sb_x$ with $0 \leq x \leq 0.4$ and with a layer thickness of up to about 50 nanometers. The $InAs_{1-x}Sb_x$ layer 20 is preferably undoped when grown by MOCVD, and has a residual n-type doping of about $10^{15}-10^{16}$ cm$^{-3}$.

One or more quantum-well layers 22 are epitaxially grown proximate to the semimetal region 16 as shown in FIG. 1. A quantum-well layer 22 is defined herein as a semiconductor layer having a layer thickness sufficiently small (e.g. $\leq 30$ nanometers thick) to produce a quantum confinement or localization of any electron-hole pairs within the layer 22. The quantum-well layers 22 can be formed from the semiconductor alloy $InAs_{1-x}Sb_x$ with $0 \leq x \leq 0.4$; and the barrier layers 24 can comprise InAs, InGaAs, InAsP or InAlAs. The semiconductor alloy selected for the quantum-well layers 22 will generally have an energy bandgap less than that of the barrier layers 24 and the second semimetal-forming layer 20. For MOCVD growth of InAs$_{1-x}$Sb$_x$ quantum-well layers 22 and InAs barrier layers 24, at 500° C. and 200 torr pressure, a V/III ratio between 16 and 32 can be used with an AsH$_3$/(AsH$_3$+TESb) ratio of about 0.6–0.8 and a growth rate of 0.9 $\mu$m/hour. Under these growth conditions, the composition, x, in the InAs$_{1-x}$Sb$_x$ quantum-well layers 22 can be varied between x=0.1 and x=0.2 as the AsH$_3$/(AsH$_3$+TESb) ratio is varied from 0.6 to 0.8. A H$_2$ purge is preferably used between the quantum-well and barrier layers as described heretofore. Electrons and holes are localized or confined within each quantum-well layer 22 and recombine to generate the infrared light.

The quantum-well alloy composition, thickness and resulting strain, if any, can be chosen to provide a desired infrared emission wavelength in the range of 2–6 $\mu$m. The quantum-well alloy composition and thickness can also be selected according to the teachings of U.S. Pat. No. 5,625,635 which is incorporated herein by reference, in order to increase an activation energy for an Auger recombination process and thereby reduce detrimental effects of Auger recombination.

To prevent aluminum that is deposited or adsorbed onto the walls of the MOCVD chamber during growth of the first-grown AlAsSb cladding layer 26 from subsequently being incorporated into the quantum-well layers 22, a two-step growth process can be used. In a first growth step, the buffer layer 28, the first-grown AlAsSb cladding layer 26, the first semimetal-forming layer 18 and at least a portion of the second semimetal-forming layer 20 are epitaxially grown. The MOCVD growth can then be interrupted so that the MOCVD quartz reaction chamber can be cleaned and any aluminum deposits removed prior to growth of the quantum-well layers 22 and other associated layers or overlayers during a second growth step. In this two-step growth process, the second semimetal-forming layer 20 preferably comprises InAs$_{1-x}$Sb$_x$ alloy with $0 \leq x \leq 0.4$, the Sb being included in the alloy to compensate the lattice constant for any aluminum that is unintentionally incorporated into the layer 20 during the first growth step.

In FIG. 1, the quantum-well layers 22 can be strained, but this strain can be accommodated by using either unstrained or oppositely strained barrier layers 24 to separate or surround each quantum-well layer 22. As an example, the active region 14 can comprise ten InAs$_{0.88}$Sb$_{0.12}$ quantum-well layers 22 each about 9 nanometers thick, separated or surrounded by 50-nanometer-thick InAs barrier layers 24 to provide an active region that is pseudomorphic with the InAs substrate 12. None of the quantum-well and barrier layers are intentionally doped, resulting in a residual n-type doping of about $10^{15}$–$10^{16}$ cm$^{-3}$.

The barrier layers 24 are formed from a semiconductor alloy having a larger energy bandgap than that of the quantum-well layers 22. The barrier layers 24 can be formed of InAs, or from the ternary alloys InGaAs, InAlAs or InAsP. In some instances, the barrier layer 24 located adjacent to the second semimetal-forming layer 20 can be omitted, with the layer 20 providing for carrier confinement within the adjacent quantum-well layer 22.

In the embodiment of the present invention in FIG. 1, a second cladding layer 26 is epitaxially grown above a last-grown barrier layer 24. The second cladding layer can have a composition, layer thickness and dopant concentration that is about that of the first cladding layer described heretofore (e.g. AlAs$_{0.16}$Sb$_{0.84}$ with a layer thickness of about 2.5 $\mu$m and an undoped residual p-type concentration of 1–3×10$^{17}$ cm$^{-3}$).

In FIG. 1, a cap layer 30 is epitaxially grown above the second cladding layer 26. The cap layer 30 can be, for example, about 20 nanometers or more of GaAs$_{0.9}$Sb$_{0.91}$, undoped with a residual p-type concentration of about 4–7×10$^{16}$ cm$^{-3}$. The cap layer 30 can also act as an oxidation barrier to prevent oxidation of the underlying AlAsSb layer 26.

For electrical activation of the infrared light source 10, a lower electrode 32 is provided for contacting a lower side of the active region 14, and an upper electrode 34 is provided for contacting an upper side of the active region 14. The lower electrode 32 can be deposited on a bottom surface of the substrate 12 and the upper electrode 34 can be deposited above the cap layer 30. The electrodes, 32 and 34, can comprise, for example, a Ti (5 nm)/Au (400 nm) metallization. To form stripe-geometry edge-emitting infrared light sources 10, the upper electrode 34 can be patterned to provide a stripe contact to the cap layer 30; whereas to form a vertically-emitting infrared light source 10, one of the electrodes 32 or 34 can be patterned to provide an aperture for transmission of the generated infrared light. The infrared light source 10 can be attached to a heat sink for operation near room temperature or at a reduced temperature.

In some embodiments of the present invention, the infrared light source 10 can be optically activated with a pump laser (e.g. a Q-switched Nd:YAG pump laser) to generate electrons and holes so that no electrical activation or electrodes 32 and 34 are required. As an example, an infrared light source 10 incorporating a plurality of 10-nanometer-thick InAs$_{0.85}$Sb$_{0.15}$ quantum-well layers 22 and 10-nanometer-thick InAs$_{0.71}$P$_{0.29}$ barrier layers 24 can be optically pumped with a Q-switched Nd:YAG pump laser to provide lasing action at a wavelength near 3.7 $\mu$m for operating temperatures up to about 240 K.

The embodiment of the present invention of FIG. 1 can be formed as a laser by providing a resonant cavity about the active region 14 to provide optical feedback for lasing action. The resonant cavity can be formed by a pair of reflecting end-mirrors 36 located on opposite ends of the infrared light source 10, separated by a distance, for example, of about 1 millimeter. The end-mirrors 36 can be cleaved along crystalline planes of the substrate 12, or alternately etched downward through the active region 14. Reflecting coatings can be applied to one or both end-mirrors 36 to enhance lasing action or directionality of the emitted infrared light.

Figure 2:
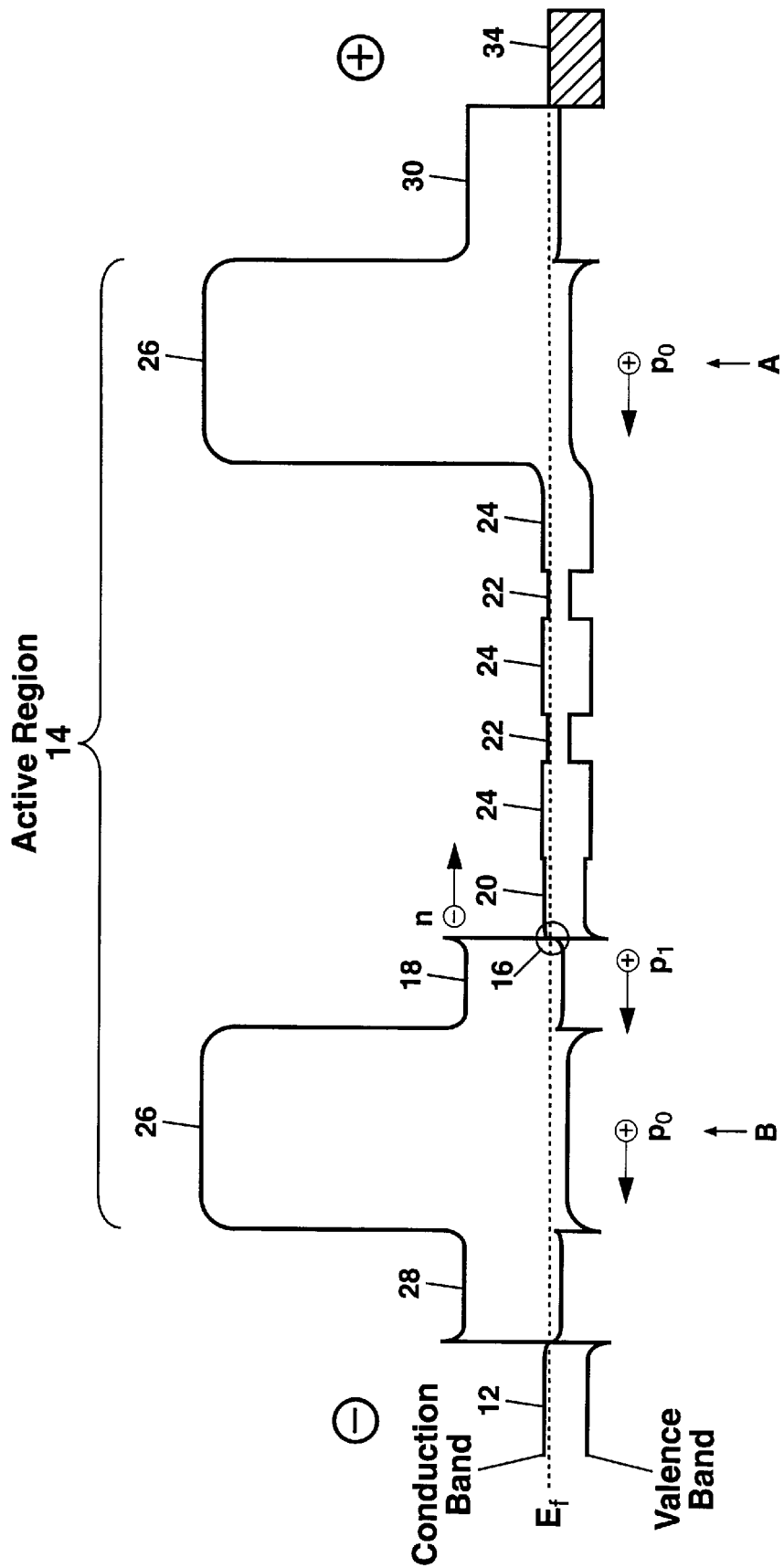
FIG. 2 shows an energy band diagram for the embodiment of the infrared light source in FIG. 1.

FIG. 2 shows an energy band diagram of the embodiment of the present invention in FIG. 1, with the polarities shown for forward bias conditions. In FIG. 2, the semimetal region 16 is formed by the overlap of the valence band of a GaAsSb layer 18 (p-type residual doping) and the conduction band of an InAs layer 20 (n-type residual doping) at a heterojunction between the two dissimilar semiconductor layers, 18 and 20. Over a wide range of Fermi energies, the GaAsSb (p)/InAs (n) heterojunction is a semi-metal, acting as a source/sink for electron-hole pairs.

Figure 7A:
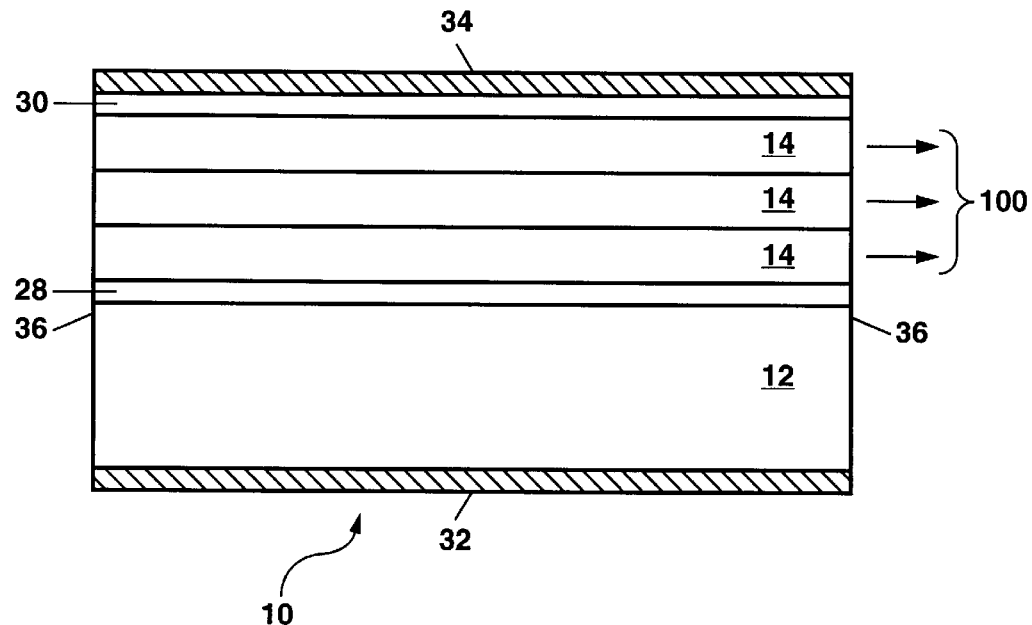
FIGS. 7A and 7B show schematic cross-section illustrations of other embodiments of the infrared light source of the present invention which employ a plurality of stacked active regions.
Figure 7B:
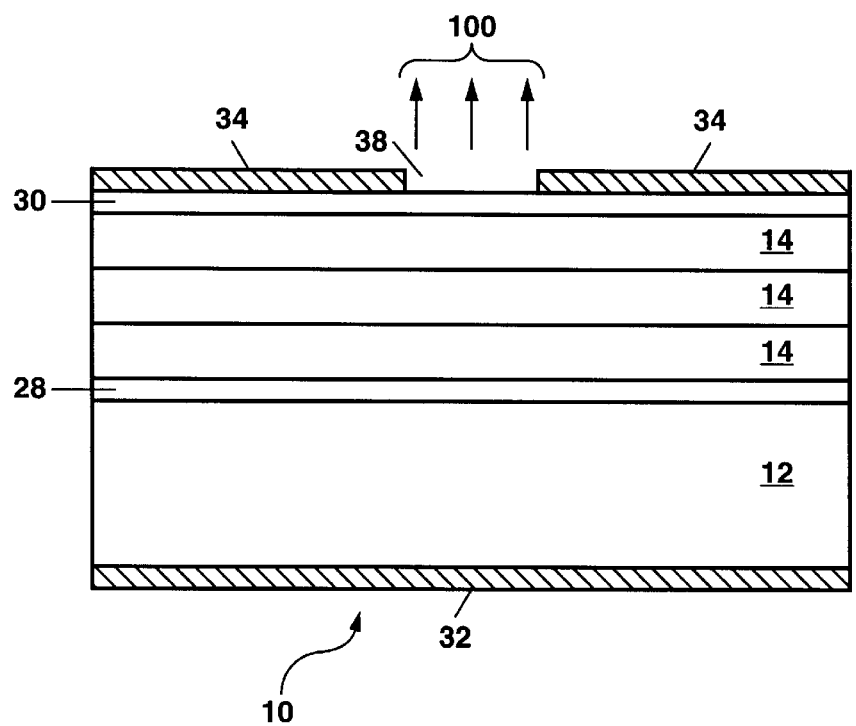

Upon forward-biasing the infrared light source 10 to provide an electrical current flow therein, electrons at an electron flux, n, and holes at a hole flux, p$_1$, are generated in the semimetal region 16 and flow in opposite directions as shown in FIG. 2. (In FIG. 2, the upper electrode 34 is shown, but the lower electrode 32 below the active region 14 has been omitted.) The electrons are swept towards the quantum-well layers 22 where they recombine with holes generated by the applied electrical current and entering the active region 14 at point "A" in FIG. 2 with a flux, $p_0$. Ideally, the hole flux exiting the active region 14 at point "B" in FIG. 2 is identical to that entering the active region due the flux of holes, $P_1$, generated in the semimetal region 16. Under these conditions, the electron and hole fluxes are related by $n=p_0-P_1$. As a result, only hole transport is observed in the cladding layers 26 at points "A" and "B"; and between these two points, the infrared light source 10 can be considered as being unipolar. The region of the active region 14 between points "A" and "B" can be repetitively grown to form a plurality of stacked active regions for forming a multi-stage or stacked LED or laser 10. Since each active region between the points "A" and "B" appears as a unipolar structure, there is no substantial impediment to electrical current flow through the plurality of active regions 14 in a stacked infrared light source 10 as shown in FIGS. 7A and 7B.

Figure 3A:
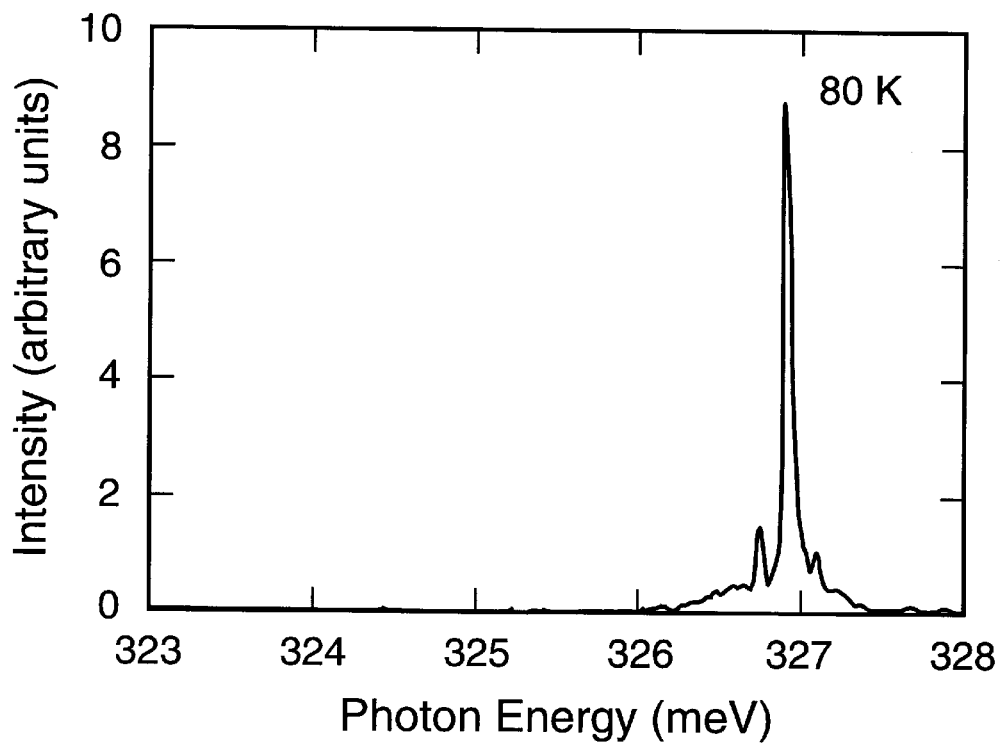
FIGS. 3A and 3B show lasing emission spectra from gain-guided stripe laser sources 10 formed according to the present invention.
Figure 3B:
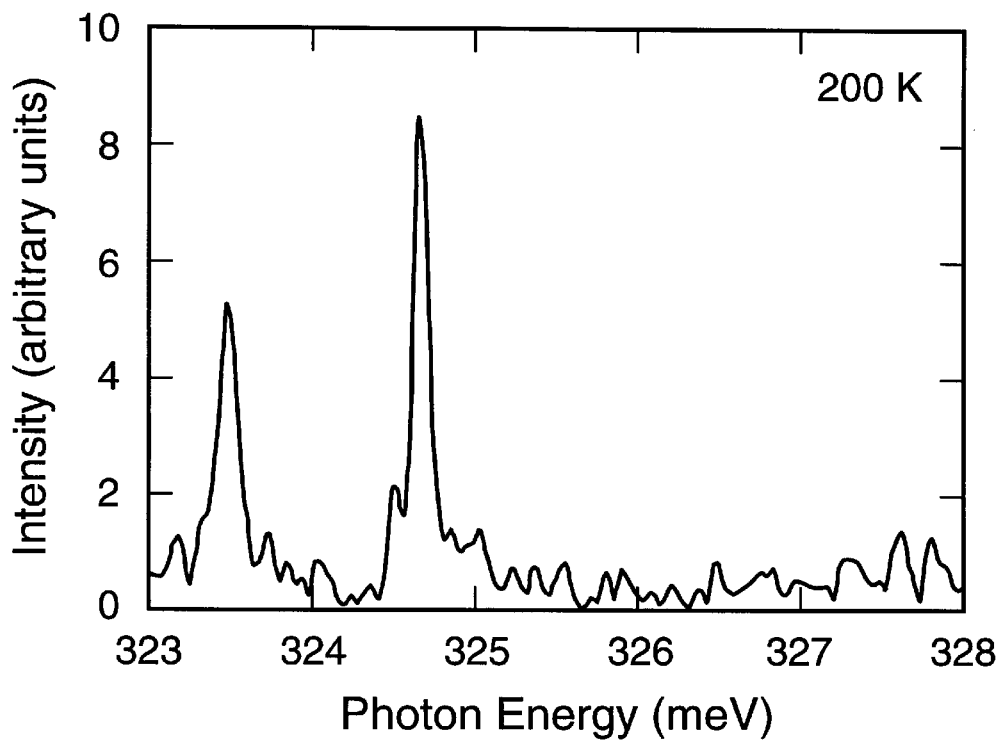

FIGS. 3A and 3B show lasing emission spectra from gain-guided stripe lasers 10 (40 μm×1000 μm or 80 μm×1000 μm stripes) fabricated with Ti/Au electrode metallizations and with uncoated cleaved end-mirrors 36. Lasing was observed for forward-bias applied electrical current pulses of 100 nanosecond duration at 10 kHz (0.1% duty cycle). No light emission was observed under reverse-biased conditions. In FIG. 3A, the infrared lasing emission at a heat-sink temperature of 80 K occurs in several longitudinal modes centered near 327 (meV) or 3.8 μm wavelength. In FIG. 3B, lasing at 200 K occurs at slightly longer wavelengths of 3.8–3.9 μm. The lasing emission is blue-shifted by about 20 meV from the peak of the InAsSb quantum-well photoluminescence. Consistent with the selection rule for the compressively strained InAsSb quantum-well electron (I½,±½>)-hole (I³⁄₂,±³⁄₂>) transition, the lasing emission was 100% TE polarized.

Figure 4:
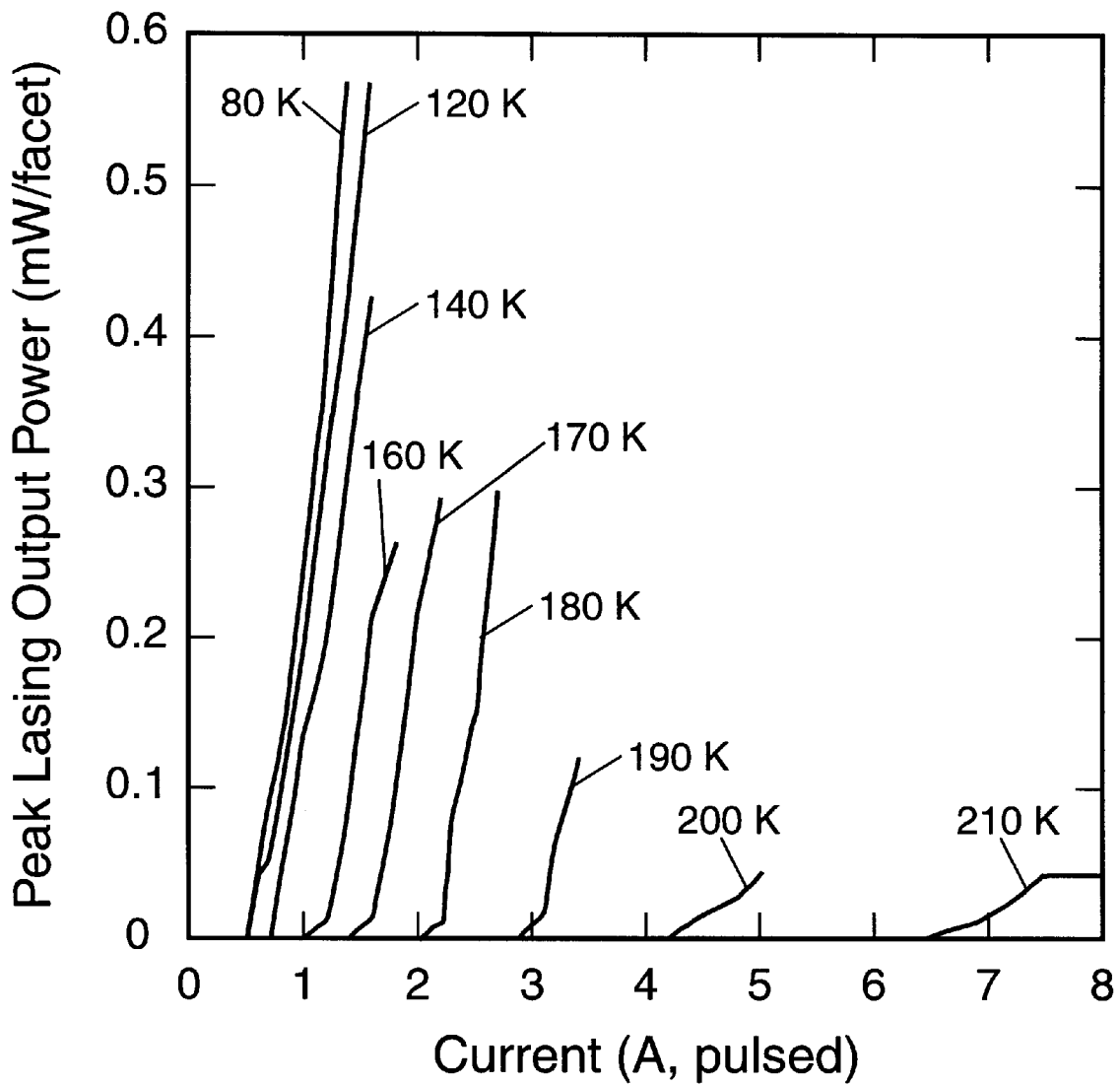
FIG. 4 shows light-vs-current (L-I) curves for a gain-guided stripe laser source 10 of the present invention over the temperature range of 80–210 K.

FIG. 4 shows light-vs-current (L-I) curves for the peak lasing output from the gain-guided stripe lasers 10 over the temperature range of 80–210 K. The lasers 10 show a sharp threshold current characteristic, with lasing observed at heat-sink temperatures up to 210 K. Under pulsed operation, peak lasing output powers of ≧1 mW/facet can be obtained.

From the curves in FIG. 4, a characteristic temperature ($T_0$) was calculated to be about 40 K over the temperature range of 120–170 K and about 30 K over the range 170–210 K. The maximum operating temperature (210 K) and characteristic temperature ($T_0$=30–40 K) are comparable to the highest values reported for any electrically injected semiconductor lasers at these wavelengths.

At a temperature of 100 K, lasing in these gain-guided stripe laser sources 10 has been observed at a maximum pulse duration of about $10^{-4}$ seconds, with a comparable recovery time. When the laser sources 10 are driven above threshold with electrical current pulses longer than $10^{-4}$ seconds, the lasing action ceases, with a different low intensity emission spectrum observed indicating extreme band bending and depletion of the semimetal region 16. Examining the infrared light source operated continuous-wave (cw) as an LED, the LED emission is observed to saturate at current densities ≧50 A/cm$^{-2}$. It is expected that lasing pulse duration, duty cycle, threshold current, and turn-on voltage of the infrared light sources 10 of the present invention can be substantially improved with other embodiments of the present invention having different doping levels and semiconductor layer structures.

The provision of an internal electron and hole source within the active region 14 by means of the semimetal region 16 allows the possibility for alternative laser and LED designs for the infrared light source 10 that would not be feasible for conventional bipolar devices. For example, a plurality of active regions 14 can be stacked to provide a multiple-wavelength or multi-color infrared light source emitting at a plurality of different wavelengths (e.g. in the case of an infrared laser source 10) or in a plurality of wavelength bands (e.g. in the case of an infrared LED source 10), which may or may not be overlapping. An infrared light source 10 having a plurality of stacked active regions 14 could also be advantageous for increasing the available infrared light output or for increasing the gain for lasing.

Figure 5A:
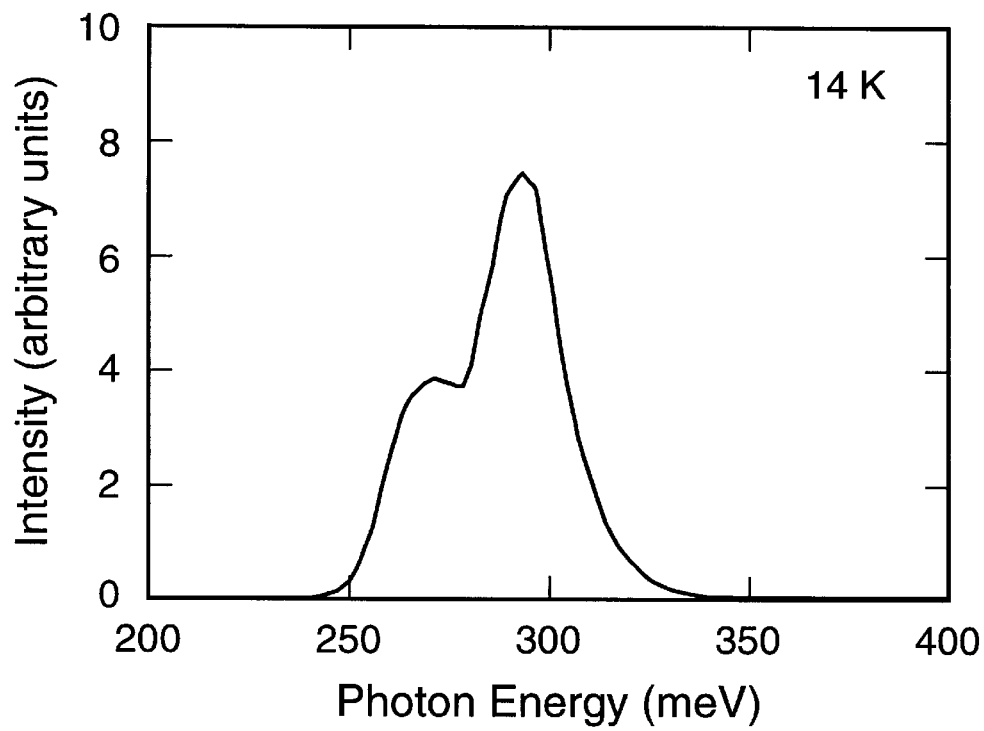
FIGS. 5A and 5B show low-temperature (14 K) infrared photoluminescence and emission spectra, respectively, from a two-color light-emitting diode (LED) formed according to the present invention.
Figure 5B:
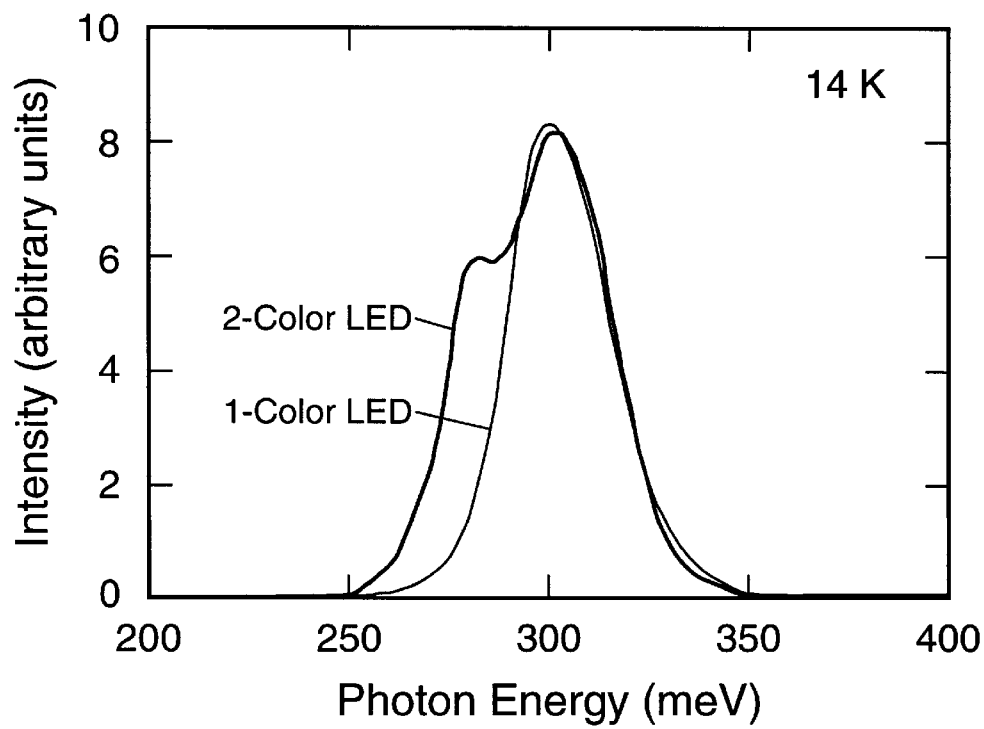

FIGS. 5A and 5B show infrared emission spectra from an example of a 2-color LED formed according to the present invention by stacking a pair of active regions 14, with a first active region having $InAs_{0.89}Sb_{0.11}$ quantum-well layers 22 and a second active region having $InAs_{0.87}Sb_{0.13}$ quantum-well layers. In the 2-color LED, only a single 60-nanometer-thick cladding layer 26 is used as an electron barrier between the pair of different-composition quantum-well layers 22.

In FIG. 5A, a low-temperature (14 K) luminescence spectrum shows the overlapping emission bands from the 2-color LED. In FIG. 5B, the infrared light emission from the 2-color LED operating at a current density of 50 A/cm$^{-2}$ is contrasted with the emission from a 1-color (i.e. a single stage) device grown during the same growth run, but removed from the MOCVD growth chamber prior to growth of the second active region 14. The relative intensity peaks of the 2-color LED source 10 in FIG. 5B are comparable to those in FIG. 5A, indicating that electrons are being independently generated by the semimetal region 16 in each stage of the device. In FIGS. 5A and 5B, absorption due to ambient carbon dioxide ($CO_2$) was eliminated from the spectra by nitrogen purging the experimental apparatus.

Figure 6:
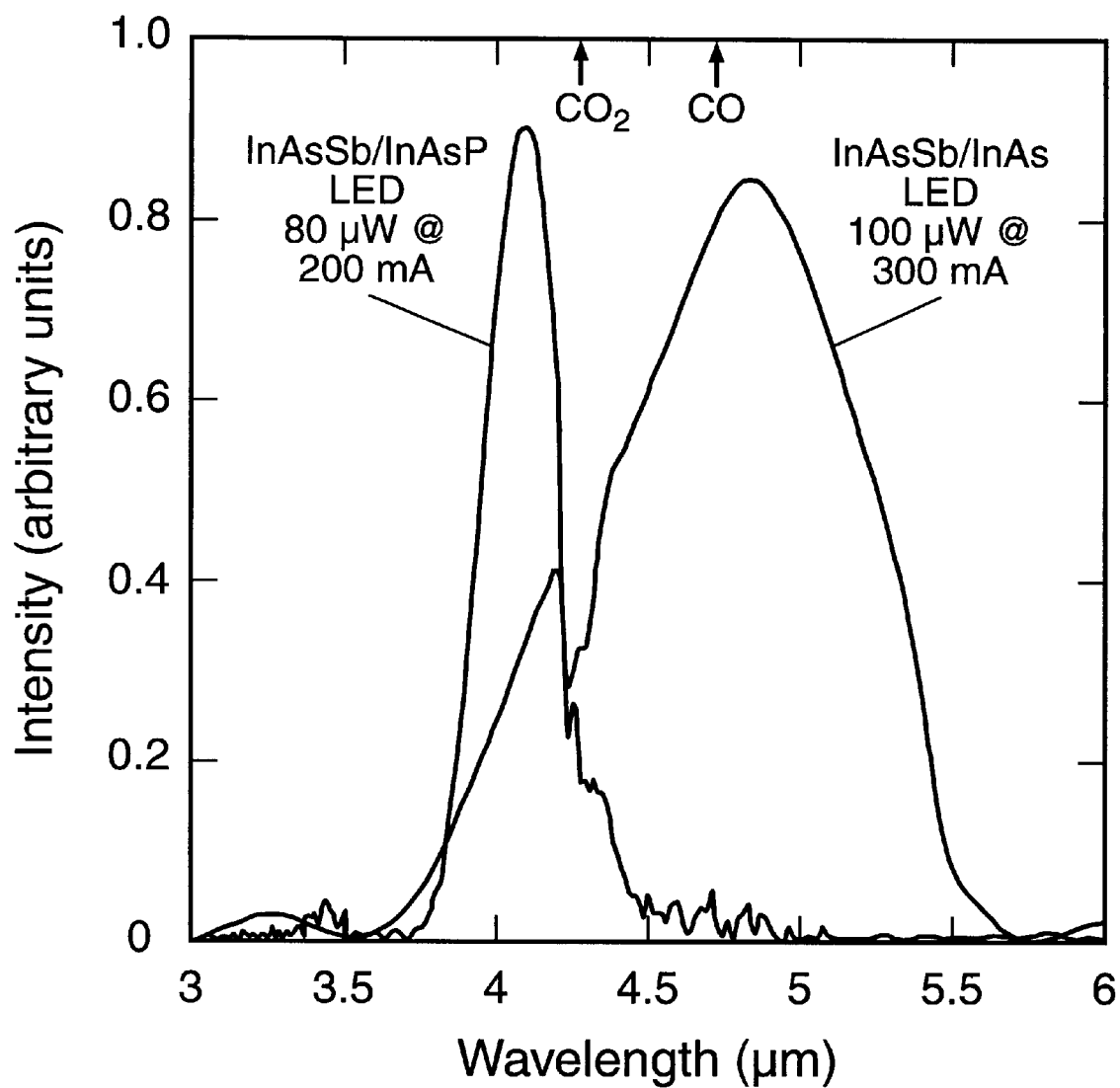
FIG. 6 shows emission spectra from two different LED embodiments of the present invention.

FIG. 6 shows emission spectra from two different LED embodiments of the present invention. The emission spectrum centered at about 4 μm wavelength in FIG. 6 is from an infrared LED light source 10 operating at 300 K with an active region 14 that comprises a semimetal region 16 formed by a 50-nanometer-thick p-type GaInSb first semimetal-forming layer 18 in contact with a 50-nanometer-thick n-type InAs second semimetal-forming layer 20, and which further comprises a plurality of 8-nanometer-thick $InAs_{0.88}Sb_{0.12}$ quantum-well layers 22 separated by 8.2-nanometer-thick $InAs_{0.75}P_{0.25}$ barrier layers 24 forming a 0.7-μm-thick strained layer superlattice. The InAsSb layers 22 can be grown by MOCVD at 500° C. and 200 torr pressure using a V/III ratio of 15–21, an $AsH_3/(AsH_3+TESb)$ ratio of 0.6–0.7, and a growth rate of 0.9 μm/hour including a $H_2$ purge between layers as described heretofore. The InAsP layers 24 can be grown under the same conditions except for using a V/III ratio of about 200 and an $AsH_3/(AsH_3+PH_3)$ ratio of about 0.02.

For this 4 μm LED infrared light source 10, a patterned 50-μm-diameter Ti/Au upper electrode 34 was used. To measure the emission spectrum, the LED infrared light source 10 was mounted onto a header with a parabolic reflecting mirror for collecting the emitted light. The distortion in the emission spectra of FIG. 6 at wavelengths near 4.3 μm is due to absorption of the infrared light by ambient carbon dioxide ($CO_2$).

In FIG. 6, an average infrared light output power of 80 μW was measured for the 4 μm source 10 at a temperature of 300 K when driven by square-wave electrical pulses at 1 kHz, 50% duty cycle, and 200 mA average current. Under the same electrical activation conditions, the average infrared light output power of this source 10 was increased to about 2 mW when the temperature was reduced to 80 K. The average output power at 300 K for the infrared light source 10 of the present invention is about 5–6 times greater the 4 $\mu$m emission of conventional LEDs without a semimetal region.

The second emission spectrum near 5 $\mu$m in FIG. 6 is from a LED infrared light source 10 comprising a single active region 14 with a semiconductor layer structure as shown in FIG. 2. The source 10 comprises a semimetal region 16 formed at an interface between a 20-nanometer-thick GaAs$_{0.09}$Sb$_{0.91}$ layer 18 and a 50-nanometer-thick InAs layer 20, ten quantum-well layers 22 of 10-nanometer-thick InAs$_{0.87}$Sb$_{0.13}$ and separated by 50-nanometer-thick InAs barrier layers 24, and a single 200-nanometer-thick AlAs$_{0.16}$Sb$_{0.84}$ cladding layer 26 above a last-grown of the InAs barrier layers 24. This 5-$\mu$m LED, when operated with square-wave electrical pulses (1 kHz, 50% duty cycle, 300 mA average current) produced an average light output power of 100 $\mu$W at 300 K. The emission spectrum of this 5 $\mu$m infrared light source 10 overlaps the absorption wavelengths of carbon dioxide (CO$_2$) and carbon monoxide (CO) (indicated by the vertical arrows in FIG. 6), thereby allowing use of this infrared light source 10 for applications requiring monitoring of these gases (e.g. automobile exhausts or combustion stacks).

FIGS. 7A and 7B schematically illustrate other embodiments of the infrared light source of the present invention which employ multiple stacked active regions 14. The embodiment of the infrared light source 10 in FIG. 7A is similar to that of FIG. 1 except that multiple active regions 14 are used for generating infrared light 100 in a direction substantially parallel to the cladding layer 26, thereby forming an edge-emitting laser or LED. The infrared laser or LED light source 10 of FIG. 7A can be formed as a stripe-geometry device by providing a stripe contact upper electrode 34.

The embodiment of the infrared light source 10 shown in FIG. 7B is similarly formed with multiple stacked active regions 14. However, in this device 10 the upper electrode 34 is patterned to provide an aperture 38 for transmission of the generated infrared light 100 in a substantially perpendicular direction, thereby forming a vertically-emitting infrared light source 10.

The multiple stacked active regions 14 in the embodiments of the present invention shown in FIGS. 7A and 7B can be used to provide an increased gain for lasing or an increased lasing output power in the infrared light source 10, or alternately to form an infrared light 10 source that emits at a plurality of different wavelengths or which generates broadband emission. Each active region 14 can be formed as described heretofore with reference to FIGS. 1 and 2. Furthermore, no tunnel junctions are needed to separate the various active regions 14 since the device 10 is unipolar.

The matter set forth in the foregoing description and accompanying drawings is offered by way of illustration only and not as a limitation. The actual scope of the invention is intended to be defined in the following claims when viewed in their proper perspective based on the prior art.

What is claimed is:

1. An infrared light source comprising:
   (a) a semiconductor substrate; and
   (b) at least one active region epitaxially grown on the semiconductor substrate, with the active region comprising a pair of adjacent semiconductor layers forming a semimetal region, and at least one quantum-well layer wherein infrared light is generated proximate to the semimetal region.

2. The infrared light source of claim 1 wherein the substrate comprises InAs.

3. The infrared light source of claim 1 wherein the semimetal region is formed by a first semiconductor layer comprising GaAsSb or GaInSb in contact with a second semiconductor layer comprising InAs$_{1-x}$Sb$_x$ with $0 \leq x \leq 0.4$.

4. The infrared light source of claim 1 wherein the active region further includes a first cladding layer located on one side of the active region to sandwich the quantum-well layer between the semimetal region and the cladding layer.

5. The infrared light source of claim 4 wherein the cladding layer comprises an antimony-containing semiconductor alloy selected from the group consisting of AlAsSb, AlSb and InPSb.

6. The infrared light source of claim 4 wherein the active region further includes a second cladding layer located on the side of the active region opposite the first cladding layer.

7. The infrared light source of claim 1 wherein each quantum-well layer comprises InAs$_{1-x}$Sb$_x$ with $0 \leq x \leq 0.4$.

8. The infrared light source of claim 1 further including electrodes above and below the active region to form an electrically-activated light-emitting diode.

9. The infrared light source of claim 8 wherein multiple active regions are stacked to form a multi-stage light-emitting diode.

10. The infrared light source of claim 8 wherein light is emitted in a direction substantially perpendicular to a cladding layer within one of the active regions.

11. The infrared light source of claim 8 wherein light is emitted in a direction substantially parallel to a cladding layer within one of the active regions.

12. The infrared light source of claim 1 further including a resonant cavity formed about the active region for generating lasing action therein.

13. The infrared light source of claim 12 further including electrodes above and below the active region to form an electrically-activated laser.

14. The infrared light source of claim 13 wherein multiple active regions are stacked to form a multi-stage electrically-activated laser.

15. The infrared light source of claim 1 wherein light is emitted at a wavelength within the range of 2–6 $\mu$m.

16. An infrared light source comprising a layered semiconductor active region including at least one quantum-well layer, and further including a semimetal region proximate to the quantum-well layer, the semimetal region upon activation providing electrons and holes to the quantum-well layer to generate light.

17. The infrared light source of claim 16 wherein each quantum-well layer comprises InAs$_{1-x}$Sb$_x$ with $0 \leq x \leq 0.4$.

18. The infrared light source of claim 16 wherein the semimetal region is formed by a junction of two dissimilar semimetal-forming semiconductor layers.

19. The infrared light source of claim 18 wherein one of the semiconductor layers comprises GaAsSb or GaInSb, and the other of the semiconductor layers comprises InAs$_{1-x}$Sb$_x$ with $0 \leq x \leq 0.4$.

20. The infrared light source of claim 16 wherein the layered active region is epitaxially grown upon an InAs substrate.

21. The infrared light source of claim 16 wherein the layered semiconductor active region further includes means for confining the electrons within each quantum-well layer.

22. The infrared light source of claim 21 wherein the means for confining the electrons within each quantum-well layer comprises barrier layers surrounding each quantum-well layer.

23. The infrared light source of claim 22 wherein the barrier layers comprise a semiconductor alloy selected from the group consisting of InAs, InGaAs, InAsP and InAlAs.

24. The infrared light source of claim 22 wherein the means for confining the electrons within each quantum-well layer comprises a cladding layer located on a side of the active region away from the semimetal region.

25. The infrared light source of claim 22 wherein the means for confining the electrons within each quantum-well layer comprises a pair of cladding layers sandwiched about the semimetal region and the at least one quantum-well layer.

26. The infrared light source of claim 16 further including electrodes above and below the active region to form an electrically-activated light-emitting diode.

27. The infrared light source of claim 16 further including a resonant cavity formed about the active region for generating lasing action therein.

28. The infrared light source of claim 27 further including electrodes above and below the active region to form an electrically-activated laser.

29. The infrared light source of claim 16 wherein the generated light is in a wavelength range of 2–6 $\mu$m.

30. A source for generating infrared light in response to an applied electrical current, comprising:
   (a) a GaAsSb or GaInSb semiconductor layer in contact with an InAsSb semiconductor layer to form a semimetal region wherein electrons and holes are generated; and
   (b) at least one quantum-well layer proximate to the semimetal region, wherein the electrons are recombined with holes to generate the infrared light.

31. The infrared light source of claim 30 further including means for confining the electrons within each quantum-well layer.

32. The infrared light source of claim 31 wherein the means for confining the electrons comprises barrier layers surrounding each quantum-well layer.

33. The infrared light source of claim 31 wherein the means for confining the electrons comprises a pair of cladding layers sandwiched about the semimetal region and the quantum-well layer.

34. The infrared light source of claim 30 wherein each quantum-well layer comprises $InAs_{1-x}Sb_x$ with $0 \leq x \leq 0.4$.

35. The infrared light source of claim 30 in the form of a light-emitting diode.

36. The infrared light source of claim 30 in the form of a semiconductor laser.

37. The infrared light source of claim 30 wherein the infrared light has a wavelength in the range of 2–6 $\mu$m.

38. An infrared light source comprising:
   (a) a semiconductor substrate; and
   (b) a plurality of active regions epitaxially grown on the semiconductor substrate to form a vertically stacked structure, with each active region comprising a pair of adjacent semiconductor layers forming a semimetal region, and at least one quantum-well layer proximate to the semimetal region.

39. The infrared light source of claim 38 wherein the semimetal region is formed by a first semiconductor layer comprising GaAsSb or GaInSb in contact with a second semiconductor layer comprising $InAs_{1-x}Sb_x$ with $0 \leq x \leq 0.4$.

40. The infrared light source of claim 38 wherein each active region includes a cladding layer between each pair of stacked active regions.

41. The infrared light source of claim 40 wherein the cladding layer comprises an antimony-containing semiconductor alloy selected from the group consisting of AlAsSb, AlSb and InPSb.

42. The infrared light source of claim 38 wherein each quantum-well layer comprises $InAs_{1-x}Sb_x$ with $0 \leq x \leq 0.4$.

43. The infrared light source of claim 38 further including electrodes above and below the plurality of active regions to form a light-emitting diode.

44. The infrared light source of claim 38 further including a resonant cavity formed about the active region for generating lasing action therein.

45. The infrared light source of claim 44 further including electrodes above and below the plurality of active regions to form an electrically-activated laser.

46. The infrared light source of claim 38 wherein light is emitted at a wavelength within the range of 2–6 $\mu$m.

* * * * *